US010032656B2

(12) United States Patent
Shinozaki

(10) Patent No.: US 10,032,656 B2
(45) Date of Patent: Jul. 24, 2018

(54) SUBSTRATE PROCESSING APPARATUS

(71) Applicant: EBARA CORPORATION, Tokyo (JP)

(72) Inventor: Hiroyuki Shinozaki, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 288 days.

(21) Appl. No.: 14/305,309

(22) Filed: Jun. 16, 2014

(65) Prior Publication Data
US 2014/0373884 A1   Dec. 25, 2014

(30) Foreign Application Priority Data
Jun. 19, 2013  (JP) ................ 2013-128711

(51) Int. Cl.
*H01L 21/67* (2006.01)
*H01L 21/687* (2006.01)

(52) U.S. Cl.
CPC .. *H01L 21/67051* (2013.01); *H01L 21/67046* (2013.01); *H01L 21/67288* (2013.01); *H01L 21/68728* (2013.01)

(58) Field of Classification Search
CPC ......... H01L 21/67051; H01L 21/68728; H01L 21/67288
See application file for complete search history.

(56) References Cited

U.S. PATENT DOCUMENTS

| | | | | |
|---|---|---|---|---|
| 6,403,322 B1* | 6/2002 | Fischer | ................. | G01N 29/12 435/6.11 |
| 2007/0039106 A1* | 2/2007 | Stansel | ................. | D06F 37/302 8/159 |
| 2007/0221125 A1* | 9/2007 | Kaushal | ............ | H01L 21/67242 118/663 |
| 2007/0289611 A1* | 12/2007 | Hayashi | ............ | H01L 21/02052 134/26 |
| 2008/0251107 A1* | 10/2008 | Osada | ................. | H01L 21/6708 134/201 |
| 2012/0028438 A1* | 2/2012 | Richter | ............... | H01L 21/6835 438/458 |
| 2012/0103255 A1* | 5/2012 | Fukuda | ................. | C23C 14/042 118/668 |

FOREIGN PATENT DOCUMENTS

JP   2000-100771 A   4/2000

* cited by examiner

*Primary Examiner* — Spencer E Bell
(74) *Attorney, Agent, or Firm* — Pearne & Gordon LLP

(57) ABSTRACT

A substrate processing apparatus configured to rotate a substrate, such as a wafer, is disclosed. The substrate processing apparatus includes: a substrate holder configured to hold and rotate a substrate; a natural frequency calculator configured to determine a natural frequency of the substrate; and a processing controller configured to control a rotational speed of the substrate based on the natural frequency of the substrate. The processing controller is configured to control the rotational speed of the substrate such that the substrate is rotated at a rotational speed that is different from a rotational speed corresponding to the natural frequency of the substrate.

12 Claims, 15 Drawing Sheets

SUBSTRATE PROCESSING APPARATUS

CROSS REFERENCE TO RELATED APPLICATION

This application claims priority to Japanese Patent Application No. 2013-128711 filed Jun. 19, 2013, the entire contents of which are hereby incorporated by reference.

BACKGROUND

In a fabrication process of a semiconductor device, a substrate processing apparatus, which is configured to rotate a wafer, is used to clean and/or dry the wafer. In order to obtain the same results in processing of multiple wafers, these wafers are processed under the same process conditions. For example, in a wafer cleaning process, each wafer is rotated at the same speed, while the wafer is supplied with a cleaning liquid at the same flow rate. In this state, the wafer is cleaned with a cleaning tool, such as a sponge or brush.

A thickness and a multilayer structure vary from wafer to wafer. Such a variation in wafer structure may affect a manner of vibration of a wafer surface when a wafer is being rotated. As a result, the processing results obtained may vary. More specifically, due to the vibration of the wafer surface, the cleaning tool, such as a sponge or brush, may contact the wafer surface in a different manner, and as a result a uniform cleaning process may not be performed.

In particular, amid an increasing trend in a wafer diameter, a natural frequency of the wafer tends to decrease, and a rotational frequency of the wafer during processing approaches the natural frequency of the wafer. As a result, the vibration of the wafer surface can be enlarged due to a rotational speed of the wafer. Therefore, when multiple wafers are processed under the same conditions, the processing results may vary greatly depending on the structure and the shape of each wafer, thus causing a lowered yield of final products. This means that there is a case where the principle, in which the same processing conditions are required in order to obtain the same processing results, does not hold true.

SUMMARY OF THE INVENTION

It is therefore an object to provide a substrate processing apparatus capable of preventing a substrate surface from vibrating violently when a substrate, such as a wafer, is being rotated and capable of stabilizing results of substrate processing, such as cleaning and drying of a substrate.

Embodiments, which will be described below, relate to a substrate processing apparatus configured to rotate a substrate in a circular shape or a rectangular shape to process the substrate, and more particularly to a substrate processing apparatus configured to rotate a substrate, such as a wafer used in fabrication of semiconductor devices, to thereby clean and/or dry the substrate.

In an embodiment, there is provided a substrate processing apparatus, comprising: a substrate holder configured to hold and rotate a substrate; a natural frequency calculator configured to determine a natural frequency of the substrate; and a processing controller configured to control a rotational speed of the substrate based on the natural frequency of the substrate.

In an embodiment, the processing controller is configured to control the rotational speed of the substrate such that the substrate is rotated at a rotational speed that is different from a rotational speed corresponding to the natural frequency of the substrate.

In an embodiment, the natural frequency calculator is configured to calculate the natural frequency of the substrate from specifications inherent in the substrate.

In an embodiment, the specifications inherent in the substrate include at least a thickness, a diameter, a density, a Young's modulus, and a Poisson's ratio of the substrate.

In an embodiment, the natural frequency calculator is configured to measure the natural frequency of the substrate held by the substrate holder.

In an embodiment, the natural frequency calculator is configured to emit an acoustic wave toward the substrate while changing a frequency of the acoustic wave, measure an amplitude of the acoustic wave reflected from the substrate, and determine the natural frequency of the substrate from the frequency of the acoustic wave at which the amplitude is maximized.

In an embodiment, the natural frequency calculator is configured to direct an acoustic wave to the substrate to vibrate the substrate while changing a frequency of the acoustic wave, measure an amplitude of a vibration of the substrate, and determine the natural frequency of the substrate from the frequency of the acoustic wave at which the amplitude is maximized.

In an embodiment, the substrate processing apparatus further comprises: a vibration frequency measuring device configured to measure a vibration frequency of a surface of the substrate when being rotated, wherein the processing controller is configured to control the rotational speed of the substrate such that the substrate is rotated at a rotational speed that is different from rotational speeds corresponding respectively to the natural frequency and the vibration frequency of the substrate.

In an embodiment, the vibration frequency measuring device includes a displacement sensor configured to measure a displacement of the surface of the substrate, and the vibration frequency measuring device is configured to determine the vibration frequency from fluctuation of the displacement.

In an embodiment, the vibration frequency measuring device is configured to irradiate the surface of the substrate with light, receive reflected light from the substrate, and determine the vibration frequency from fluctuation of an intensity of the reflected light.

In an embodiment, the processing controller is configured to change a processing time of the substrate based on the rotational speed of the substrate.

In an embodiment, the substrate processing apparatus further comprises: a fluid supply nozzle configured to supply a fluid onto a surface of the substrate; and a flow-rate regulating valve configured to regulate a flow rate of the fluid, wherein the processing controller is configured to control the flow rate of the fluid through the flow-rate regulating valve based on the rotational speed of the substrate.

In an embodiment, the natural frequency calculator is configured to measure an amplitude of a vibration of the substrate when being rotated, and the processing controller is configured to stop the rotation of the wafer if the amplitude of the vibration of the substrate is larger than a predetermined threshold value.

According to the above described embodiments, the substrate is rotated at a rotational speed deviating from the natural frequency of the substrate. Therefore, resonance of the substrate is avoided, and the surface of the substrate is prevented from vibrating violently. As a result, a cleaning tool and/or a processing liquid (e.g., a cleaning liquid or rinsing liquid) can contact the surface of the substrate uniformly, thus achieving uniform processing of the substrate.

DETAILED DESCRIPTION OF EMBODIMENTS

Figure 1:
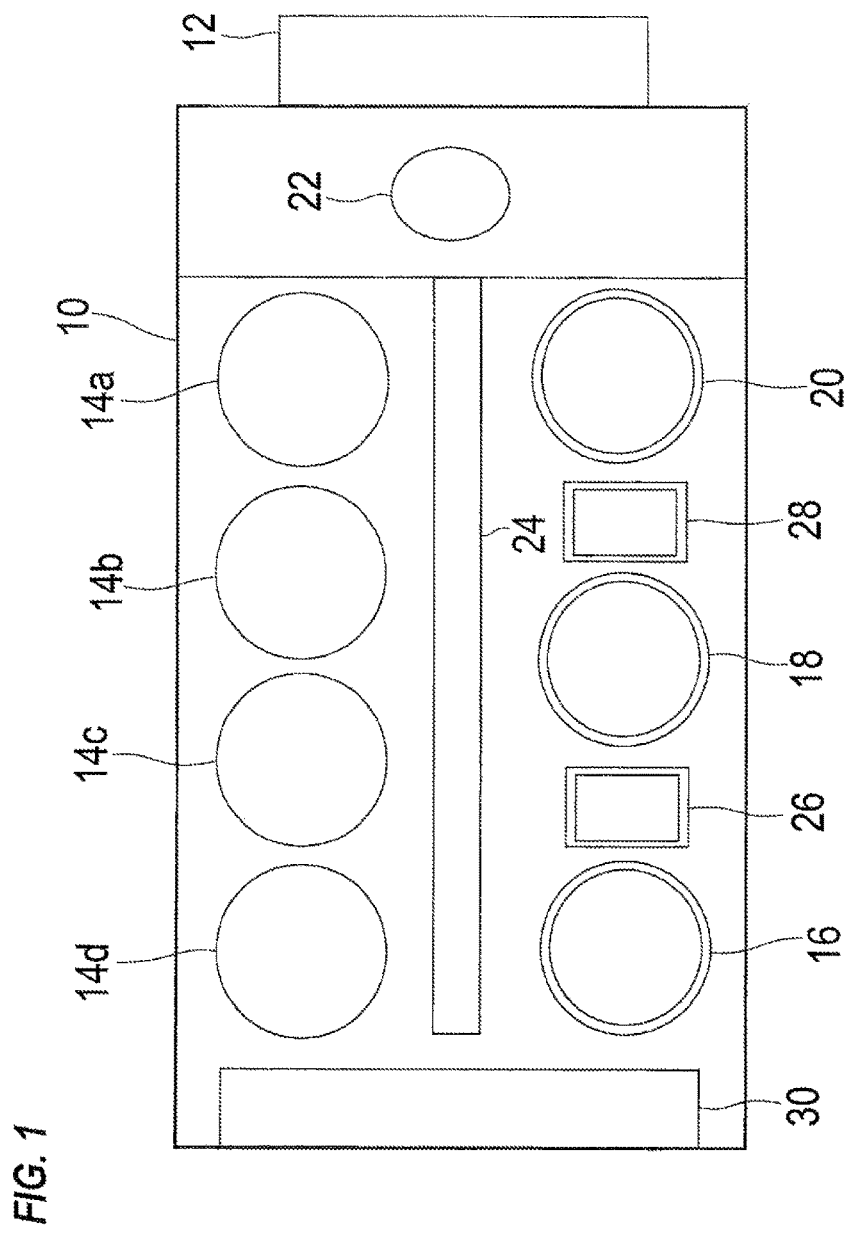
FIG. 1 is a plan view showing a whole structure of a polishing apparatus including a substrate processing apparatus according to an embodiment.

Embodiments will now be described with reference to the drawings. FIG. 1 is a plan view showing an overall construction of a polishing apparatus incorporating a substrate processing apparatus according to an embodiment. As shown in FIG. 1, the polishing apparatus includes an approximately-rectangular housing 10, and a loading port 12 on which a substrate cassette is placed. The substrate cassette houses therein a large number of substrates, such as semiconductor wafers. The loading port 12 is disposed adjacent to the housing 10. The loading port 12 can be mounted with an open cassette, a SMIF (Standard Manufacturing Interface) pod, or a FOUP (Front Opening Unified Pod). SMIF and FOUP are each an airtight container which houses a substrate cassette therein and which, by covering it with a partition wall, can isolate its internal environment from an external environment.

In the housing 10 are provided a plurality of (e.g., four as illustrated) polishing units 14a, 14b, 14c, 14d, a first cleaning unit 16 and a second cleaning unit 18 each for cleaning a polished substrate, and a drying unit 20 for drying the cleaned substrate. The polishing units 14a to 14d are arranged along a longitudinal direction of the polishing apparatus, and the cleaning units 16, 18 and the drying unit 20 are also arranged along the longitudinal direction of the polishing apparatus.

A first substrate transfer robot 22 is disposed in an area surrounded by the loading port 12, the polishing unit 14a, and the drying unit 20. Further, a substrate transport unit 24 is disposed parallel to the arrangement direction of the polishing units 14a to 14d. The first substrate transfer robot 22 receives a substrate to be polished from the loading port 12 and transports the substrate to the substrate transport unit 24, and receives a dried substrate from the drying unit 20 and returns the dried substrate to the loading port 12. The substrate transport unit 24 transports a substrate after receiving it from the first substrate transfer robot 22, and transports the substrate between the polishing units 14a to 14d. Each of the polishing units 14a to 14d is configured to polish a surface of a substrate, such as a wafer, by bringing the substrate into sliding contact with a polishing surface while supplying a polishing liquid (or slurry) onto the polishing surface.

A second substrate transfer robot 26 for transferring a substrate between the first cleaning unit 16 and the second cleaning unit 18 is provided between these units 16, 18. A third substrate transfer robot 28 for transferring a substrate between the second cleaning unit 18 and the drying unit 20 is provided between these units 18, 20. An operation controller 30 for controlling operations of each one of the units of the polishing apparatus is provided in the housing 10.

The first cleaning unit 16 is a substrate processing apparatus according to an embodiment for cleaning a substrate by scrubbing both a front surface and a rear surface of the substrate with cleaning tools, such as roll sponges, in the presence of a cleaning liquid. The second cleaning unit 18 is a substrate cleaning apparatus of pen sponge type. The drying unit 20 is a spin drying apparatus configured to hold the substrate, eject IPA vapor from a moving nozzle onto the substrate to dry the substrate, and rotate the substrate at a high speed to further dry the substrate via a centrifugal force.

Figure 2:
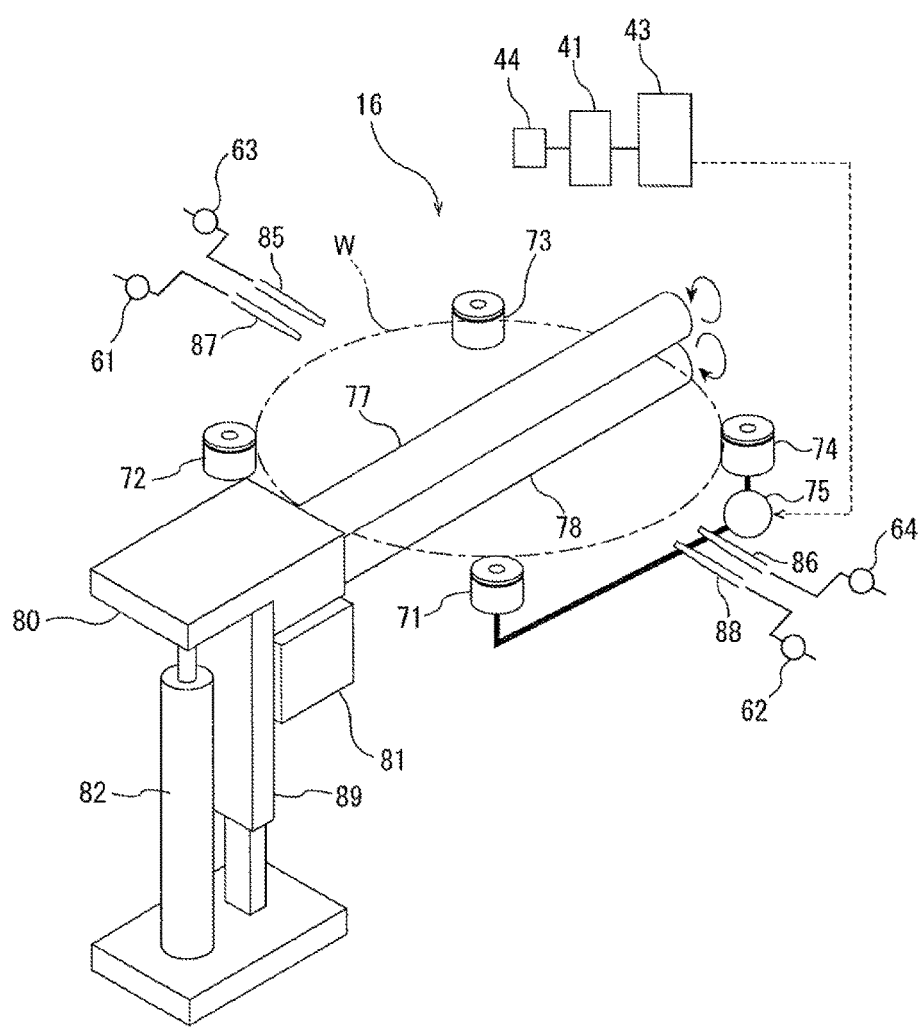
FIG. 2 is a perspective view showing the substrate processing apparatus according to an embodiment.

FIG. 2 is a perspective view showing the first cleaning unit (i.e., substrate processing apparatus) 16. As shown in FIG. 2, the first cleaning unit 16 includes four holding rollers 71, 72, 73, and 74 for horizontally holding and rotating a wafer W, roll sponges (i.e., cleaning tools) 77, 78 in a column shape which are brought into contact with an upper surface and a lower surface of the wafer W, respectively, cleaning-tool rotating devices 80, 81 for rotating these roll sponges 77, 78, respectively, upper rinsing liquid supply nozzles 85, 86 for supplying rinsing liquid (for example, pure water) onto the upper surface of the wafer W, and upper cleaning liquid supply nozzles 87, 88 for supplying cleaning liquid (for example, chemical liquid) onto the upper surface of the wafer W. Although not shown in the drawings, the first cleaning unit 16 further includes lower rinsing liquid supply nozzles for supplying rinsing liquid (for example, pure water) onto the lower surface of the wafer W, and lower cleaning liquid supply nozzles for supplying cleaning liquid (for example, chemical liquid) onto the lower surface of the wafer W.

Flow-rate regulating valves 61, 62 are coupled to the upper cleaning liquid supply nozzles 87, 88, respectively, and flow-rate regulating valves 63, 64 are coupled to the upper rinsing liquid supply nozzles 85, 86, respectively. A flow rate of the cleaning liquid and a flow rate of the rinsing liquid to be supplied onto the wafer W can be regulated by the corresponding flow-rate regulating valves 61 to 64.

The holding rollers 71, 72, 73, 74 are configured to be movable in directions closer to and away from the wafer W by a non-illustrated moving mechanism (e.g., an air cylinder). Of the four holding rollers, the two holding rollers 71, 74 are coupled to a substrate rotating mechanism 75, which rotates the holding rollers 71, 74 in the same direction. While the four holding rollers 71, 72, 73, 74 are holding the wafer W, the two holding rollers 71, 74 are rotated to thereby rotate the wafer W about its own axis. In this embodiment, a substrate holder for holding and rotating the wafer W is constituted by the holding rollers 71, 72, 73, 74 and the substrate rotating mechanism 75.

The cleaning-tool rotating device 80, which is configured to rotate the upper roll sponge 77, is mounted to a guide rail 89 that guides a vertical movement of the cleaning-tool rotating device 80. The cleaning-tool rotating device 80 is supported by an elevating device 82 so that the cleaning-tool rotating device 80 and the upper roll sponge 77 are moved in the vertical direction by the elevating device 82. Although not shown in FIG. 2, the cleaning-tool rotating device 81, which is configured to rotate the lower roll sponge 78, is also mounted to a guide rail. The cleaning-tool rotating device 81 and the lower roll sponge 78 are moved vertically by an elevating device (not shown). A motor-drive mechanism employing a ball screw, an air cylinder, or the like is used as the elevating device. When the wafer W is to be cleaned, the roll sponges 77, 78 are moved closer to each other until the roll sponges 77, 78 contact the upper and lower surfaces of the wafer W, respectively. Instead of the roll sponges, roll brushes may be used as the cleaning tools.

A process of cleaning the wafer W will now be described. First, the wafer W is rotated about its axis by the holding rollers 71, 72, 73 and 74. Next, the cleaning liquid is supplied from the upper cleaning liquid supply nozzles 87, 88 and the not-shown lower cleaning liquid supply nozzles onto the upper surface and the lower surface of the wafer W. While rotating the wafer W and supplying the cleaning liquids to the wafer W, the roll sponges 77, 78 are rotated about their horizontally-extending axes and rubbed against the upper and lower surfaces of the wafer W to scrub the upper and lower surfaces of the wafer W.

After the scrub-cleaning of the wafer W, rinsing of the wafer W is performed by supplying the pure water as the rinsing liquid to the rotating wafer W. The rinsing of the wafer W may be performed while rubbing the roll sponges 77, 78 against the upper and lower surfaces of the wafer W or while keeping the roll sponges 77, 78 away from the upper and lower surfaces of the wafer W.

The first cleaning unit (substrate processing apparatus) 16 further includes a natural frequency calculator 41 for determining a natural frequency of the wafer W, and a processing controller 43 for controlling a rotational speed of the wafer W based on the natural frequency of the wafer W. An input device 44 is coupled to the natural frequency calculator 41 so that specifications (or characteristic factors) inherent in the wafer W can be input into the natural frequency calculator 41 through the input device 44. The natural frequency calculator 41 is configured to calculate the natural frequency of the wafer W based on the specifications of the wafer W, which may include a thickness, a diameter, a density, a Young's modulus, and a Poisson's ratio of the wafer W.

The natural frequency calculator 41 calculates a natural frequency fi [Hz] using the following equations (1) and (2).

$$fi = (1/2\pi)*(\lambda i * C/d)^2 \quad (1)$$

$$C = \sqrt[4]{\frac{E*t^2}{12*\rho*(1-v^2)}} \quad (2)$$

where d represents a diameter of the wafer W, E represents a Young's modulus of the wafer W, t represents a thickness of the wafer W, v represents a Poisson's ratio of the wafer W, ρ represents a density of the wafer W, λt represents a non-dimensional natural frequency of the wafer W (or a coefficient determined from a mode of vibration), and i represents an order of a mode of vibration (i=1, 2, 3, ... ).

Figure 3:
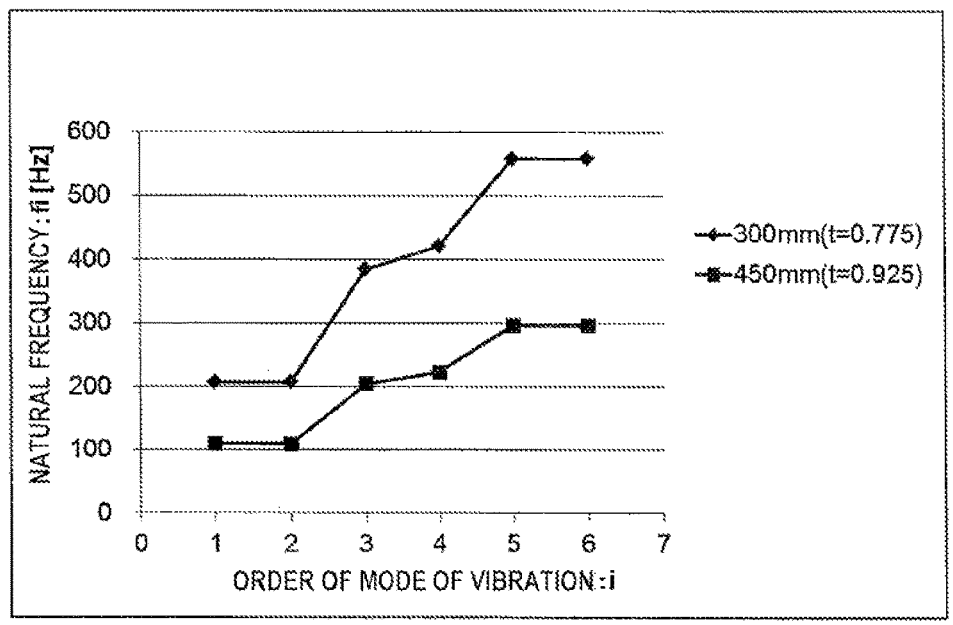
FIG. 3 is a graph showing calculated values of natural frequency of a wafer having a diameter of 300 mm and a wafer having a diameter of 450 mm.
Figure 4:
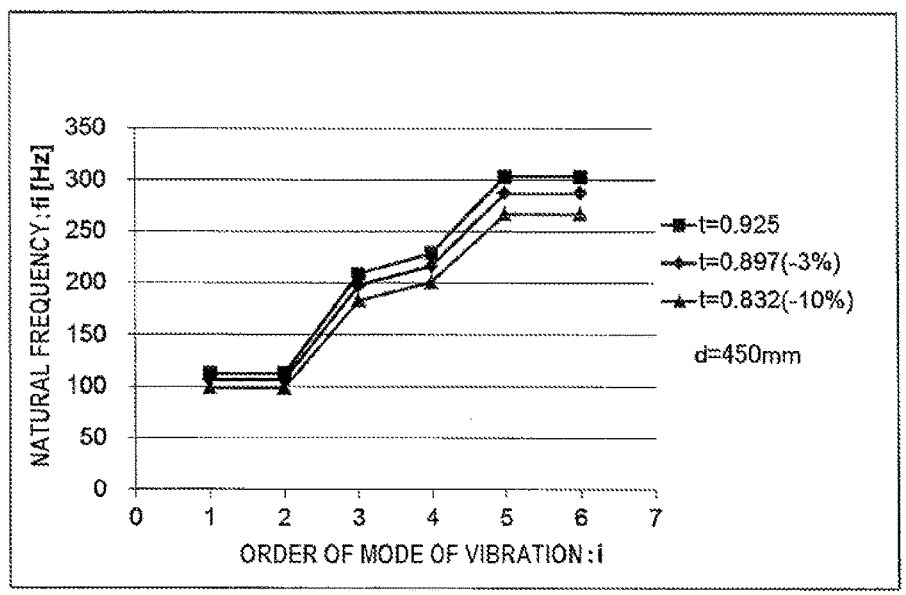
FIG. 4 is a graph illustrating a change in the calculated value of the natural frequency in accordance with a thickness of a wafer.

FIG. 3 is a graph showing calculated values of natural frequency of a wafer having a diameter of 300 mm and a wafer having a diameter of 450 mm. It can be seen from FIG. 3 that as the diameter of the wafer increases by half, the natural frequency is halved. FIG. 4 is a graph illustrating a change in the calculated value of the natural frequency in accordance with the thickness of the wafer. It can be seen from FIG. 4 that the natural frequency of the wafer decreases according to the decrease in the thickness of the wafer.

The natural frequency calculated by the natural frequency calculator 41 is sent to the processing controller 43, which controls the rotational speed of the wafer W through the substrate rotating mechanism 75 such that the wafer W is rotated at a rotational speed that is different from a rotational speed corresponding to the calculated natural frequency. More specifically, the processing controller 43 calculates a rotational speed [rpm or min$^{-1}$] corresponding to the calculated natural frequency [Hz] and controls the operation of the substrate rotating mechanism 75 such that the wafer W is rotated at a rotational speed different than the calculated rotational speed.

In this manner, since the rotational speed of the wafer W during processing does not coincide with the rotational speed corresponding to the natural frequency of the wafer W, resonance of the wafer W does not occur. Therefore, the surface of the rotating wafer W does not vibrate largely, and the roll sponge can contact the surface of the wafer W uniformly to thereby process the surface of the wafer W uniformly. In order to avoid the resonance of the wafer W reliably, a difference between the rotational speed of the wafer W and the rotational speed corresponding to the natural frequency of the wafer W is preferably not less than 60 [min$^{-1}$].

If the rotational speed of the wafer W is changed during processing, a processing time of the wafer W and an amount of fluid (e.g., the cleaning liquid, the rinsing liquid) to be supplied to the wafer W may be insufficient or may be excessive. Thus, the processing controller 43 may preferably change the processing time of the wafer W and/or a flow rate of the fluid to be supplied to the wafer W based on the rotational speed of the wafer W. For example, in a case where the rotational speed of the wafer W is lowered, the processing time of the wafer W is increased or the flow rate of the fluid to be supplied to the wafer W is increased. In this case, both the processing time of the wafer W and the flow rate of the fluid to be supplied to the wafer W may be increased.

According to the substrate processing apparatus shown in FIG. 2, the processing controller 43 can change the flow rates of the cleaning liquid and the rinsing liquid by operating the flow-rate regulating valves 61 to 64. The processing controller 43 stores therein a data base indicating a correspondence relationship (or a correlation) between the rotational speed of the wafer W and the flow rate of the fluid to be supplied to the wafer W. The processing controller 43 determines the flow rate corresponding to the rotational speed of the wafer W based on this data base, and operates the flow-rate regulating valves 61 to 64 such that the fluid is supplied to the wafer W at the determined flow rate. In the embodiment shown in FIG. 2, the fluid to be supplied to the wafer W is the cleaning liquid and the rinsing liquid to be supplied to the upper surface and the lower surface of the wafer W.

Figure 5:
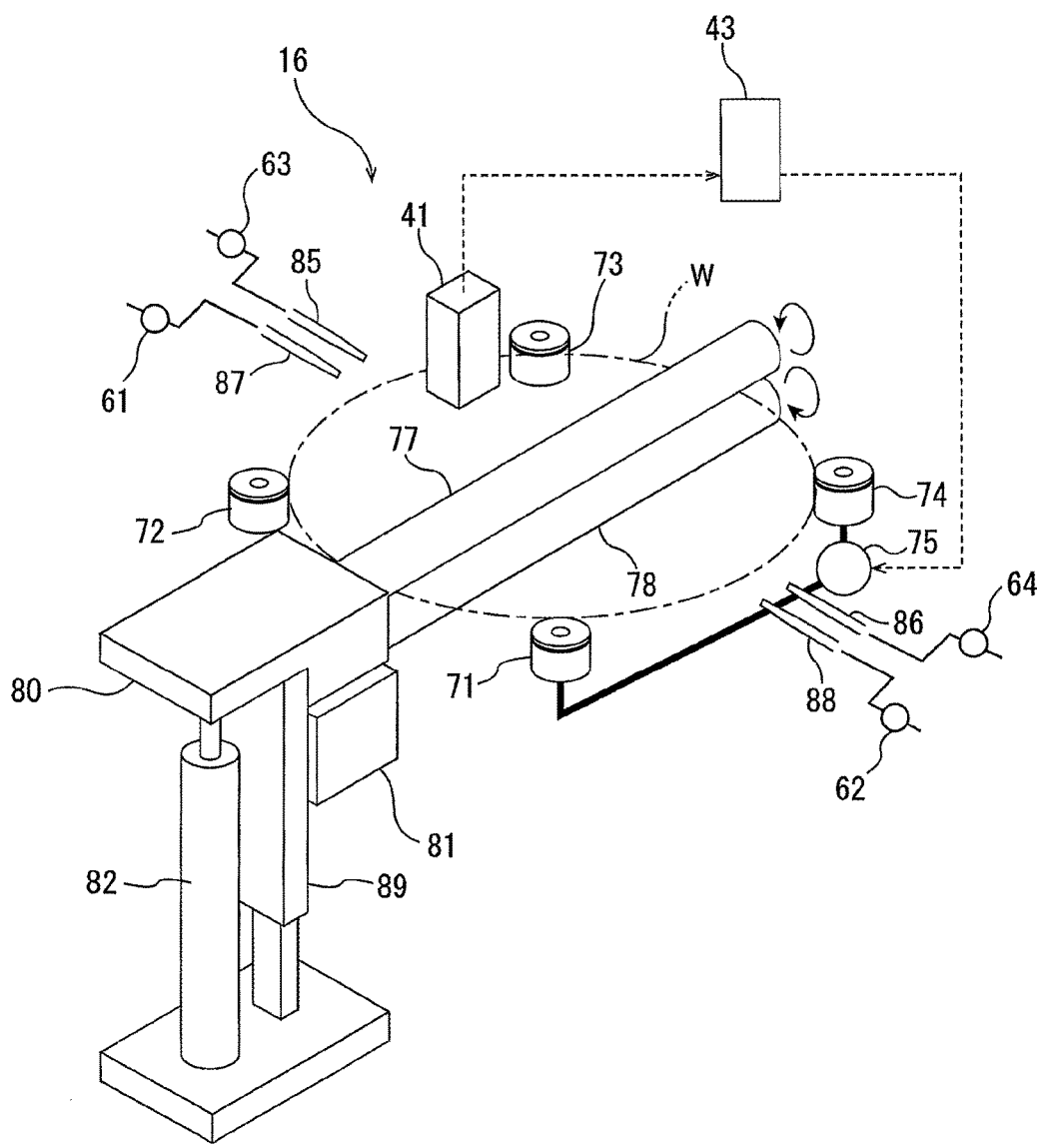
FIG. 5 is a schematic view showing the substrate processing apparatus according to another embodiment.

FIG. 5 is a schematic view showing the substrate processing apparatus according to another embodiment. Structures of this embodiment, which will not be described particularly, are identical to those of the embodiment shown in FIG. 2 and repetitive descriptions thereof will be omitted. In this embodiment, the natural frequency calculator 41 is configured to measure the natural frequency of the wafer W held by the holding milers 71, 72, 73, 74, instead of calculating the natural frequency of the wafer W. Therefore, in this embodiment, the input device 44 is not provided.

Figure 6:
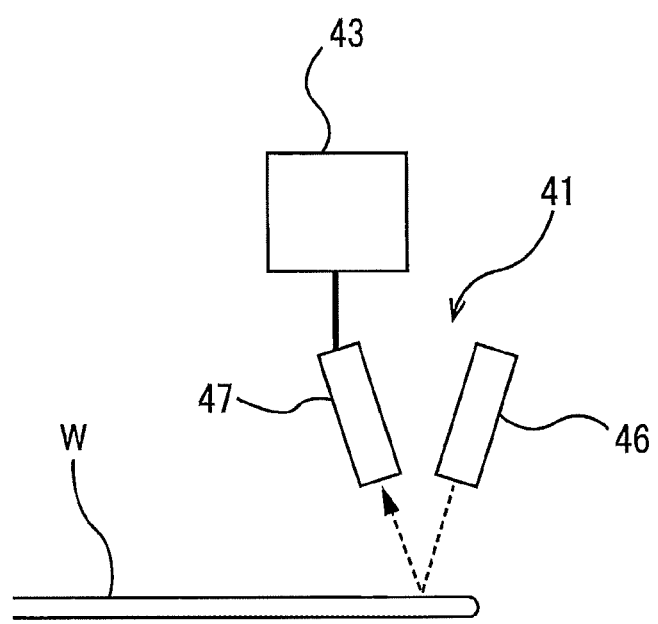
FIG. 6 is a schematic view showing a natural frequency calculator shown in FIG. 5.

FIG. 6 is a schematic view showing the natural frequency calculator 41 shown in FIG. 5. As shown in FIG. 6, the natural frequency calculator 41 has an acoustic-wave generator 46 configured to emit an acoustic wave toward the wafer W, and an acoustic-wave analyzer 47 configured to measure an amplitude of the acoustic wave reflected from the wafer W. The acoustic-wave generator 46 is disposed above the wafer W held by the holding rollers 71, 72, 73, 74, and is configured to direct the acoustic wave to the surface of the wafer W while changing a frequency of the acoustic wave. The acoustic-wave analyzer 47 is configured to measure the amplitude of the acoustic wave reflected from the wafer W and determine the natural frequency of the wafer W from a frequency of the acoustic wave at which the amplitude is maximized. For example, the acoustic-wave analyzer 47 analyzes the acoustic wave, reflected from the wafer W, with use of FFT (fast Fourier transformation) to obtain a relationship between the frequency and the amplitude of the acoustic wave and determines the natural frequency of the wafer W which is a peak frequency at which the amplitude is maximized.

The determined natural frequency is sent to the processing controller 43, which controls the rotational speed of the wafer W via the substrate rotating mechanism 75 such that the wafer W is rotated at a rotational speed that is different from a rotational speed corresponding to the determined natural frequency.

Figure 7:
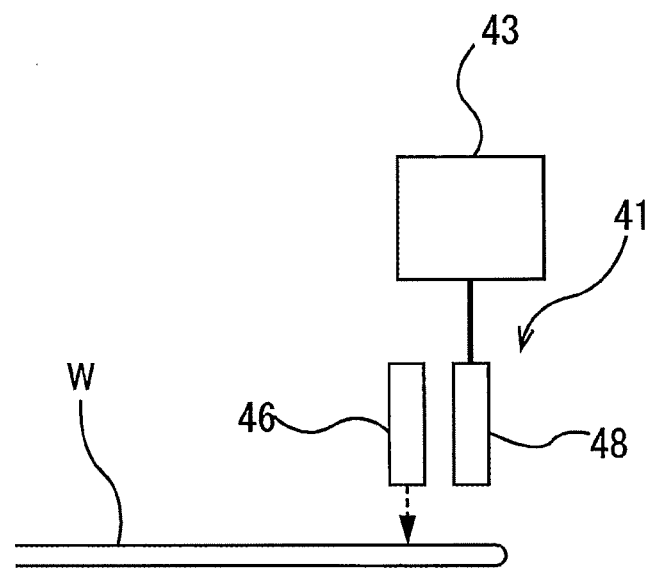
FIG. 7 is a schematic view showing the natural frequency calculator according to another embodiment.

FIG. 7 is a schematic view showing the natural frequency calculator 41 according to another embodiment. The natural frequency calculator 41 in this embodiment is the same as the above-described natural frequency calculator 41 shown in FIG. 5 in that the acoustic wave is applied to the surface of the wafer W, but is different in that an amplitude of the wafer W that is vibrating as a result of a collision with the acoustic wave is measured.

As shown in FIG. 7, the natural frequency calculator 41 has acoustic-wave generator 46 configured to emit an acoustic wave toward the wafer W, and a vibration measuring device 48 configured to measure an amplitude of the vibrating wafer W. The acoustic-wave generator 46 is disposed above the wafer W held by the holding rollers 71, 72, 73, 74, and is configured to direct the acoustic wave to the surface of the wafer W to vibrate the wafer W while changing a frequency of the acoustic wave. The vibration measuring device 48 is configured to measure the amplitude of the wafer W that is vibrating as a result of a collision with the acoustic wave and determine the natural frequency of the wafer W from a frequency of the acoustic wave at which the amplitude is maximized. A non-contact type vibrometer may be used as the vibration measuring device 48 for measuring the amplitude of the vibration of the wafer W.

The determined natural frequency is sent to the processing controller 43, which controls the rotational speed of the wafer W via the substrate rotating mechanism 75 such that the wafer W is rotated at a rotational speed that is different from a rotational speed corresponding to the determined natural frequency.

The vibration measuring device 48 may measure the amplitude of the vibration of the wafer W during processing of the wafer W and the processing controller 43 may stop the rotation of the wafer W if the amplitude of the vibration of the wafer W is larger than a predetermined threshold value. Such a control operation can prevent a damage to the wafer W.

Figure 8:
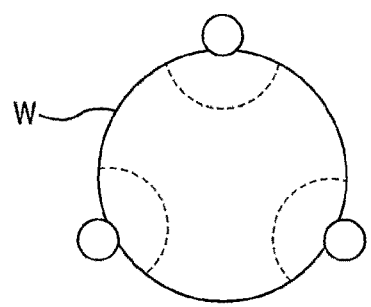
FIG. 8 is a schematic view illustrating undulation of wafers each held by the holding rollers.
Figure 8:
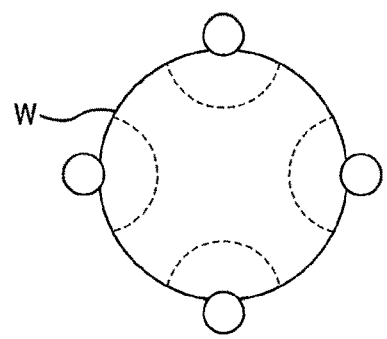
Figure 8:
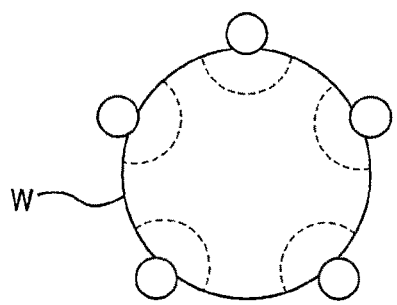
Figure 8:
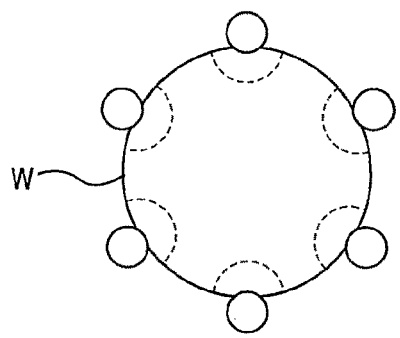

It would be ideal if the surface of the wafer W during processing is completely flat. However, the surface of the wafer W may undulate due to a multilayer-forming process, a weight of the wafer W itself, forces applied from the holding rollers, and other factors. FIG. 8 is a schematic view illustrating undulation of wafers W each held by the multiple holding rollers. Specifically, FIG. 8 shows a wafer W held by three holding rollers, a wafer W held by four holding rollers, a wafer W held by five holding rollers, and a wafer W held by six holding rollers. Each wafer W undulates largely at portions that contact the holding rollers. In FIG. 8, undulating regions of the wafer W are indicated by dotted lines. It can be seen from FIG. 8 that, as the number of holding rollers (i.e., the number of wafer holding points) increases, a degree of the undulation decreases while the number of undulations of the wafer W increases.

Figure 9:
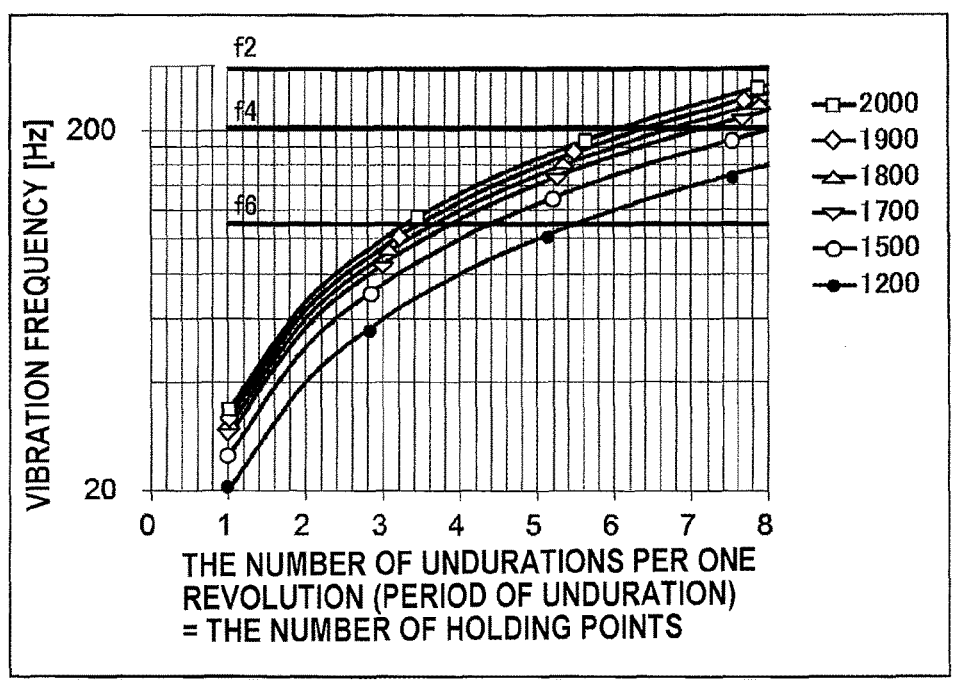
FIG. 9 is a graph showing a relationship between vibration frequency and the number of undulations per one revolution of a wafer when the rotational speed of the wafer is changed within a range of 1200 to 2000 $\text{min}^{-1}$.

When the undulating wafer W is rotated, the surface of the wafer W vibrates periodically. Hereinafter, a frequency of this vibration of the surface of the wafer W, which is caused by the undulation of the wafer W, will be referred to as vibration frequency. FIG. 9 is a graph showing a relationship between the vibration frequency and the number of undulations per one revolution of the wafer W when the rotational speed of the wafer W is changed within a range of 1200 to 2000 $min^{-1}$. In the graph shown in FIG. 9, vertical axis represents the vibration frequency [Hz], and horizontal axis represents the number of undulations per one revolution of the wafer, i.e., the number of wafer holding points. Further, the graph in FIG. 9 shows the natural frequencies f2, f4, f6 when the mode of vibration is 2, 4, 6, respectively.

In the case where the wafer W is held at four points, it can be seen from FIG. 9 that, when the wafer W is rotated at the rotational speed of 1700 $min^{-1}$, the vibration frequency of the wafer W approaches the natural frequency f2. If the vibration frequency coincides with the natural frequency of the wafer W, the wafer W is likely to vibrate.

Figure 10:
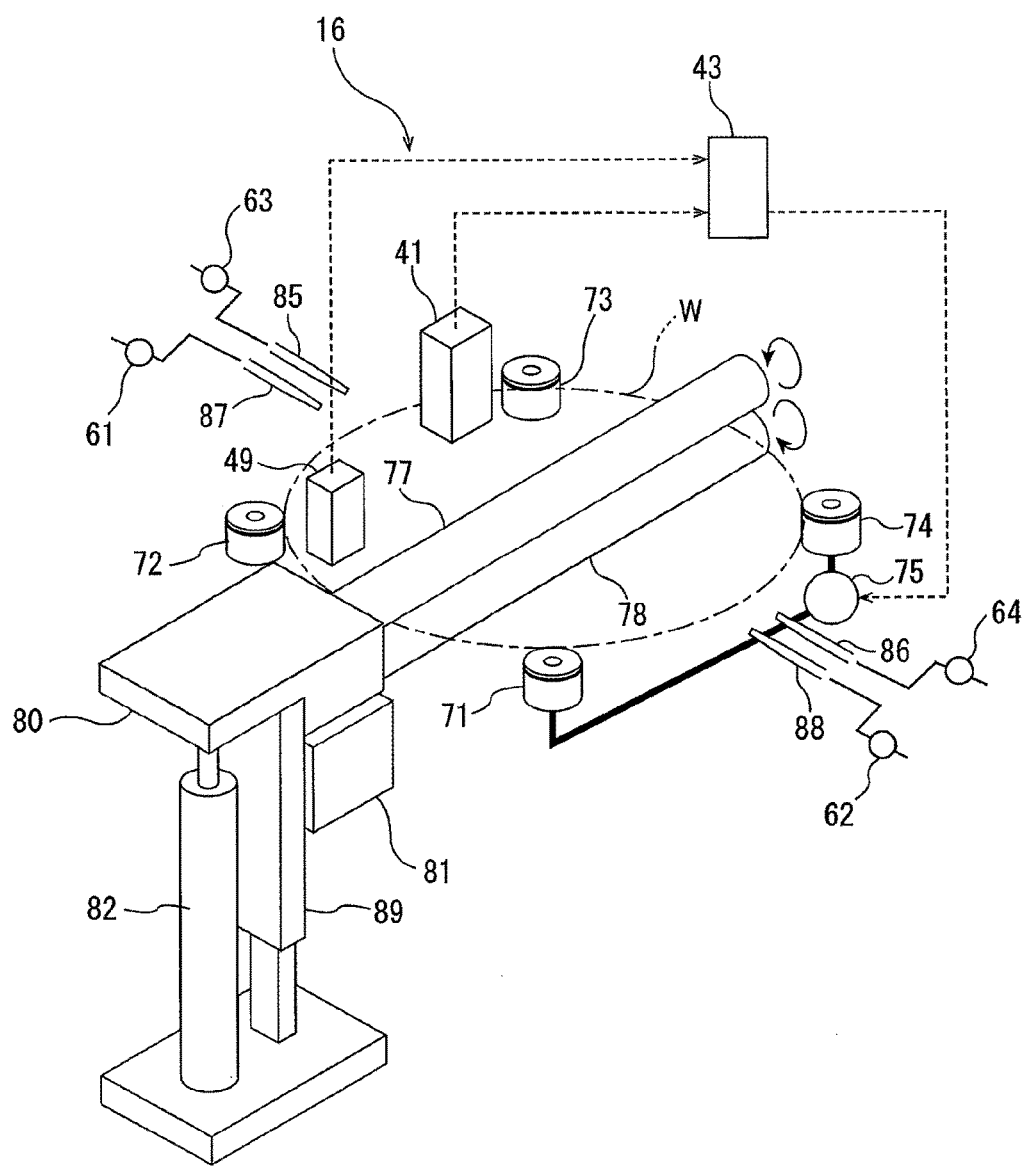
FIG. 10 is a schematic view showing the substrate processing apparatus according to still another embodiment.

Thus, in an embodiment, the vibration frequency of the surface of the rotating wafer W is measured. FIG. 10 is a schematic view showing the substrate processing apparatus according to still another embodiment. Structures of this embodiment, which will not be described particularly, are identical to those of the embodiment shown in FIG. 5 and repetitive descriptions thereof will be omitted. The substrate processing apparatus according to this embodiment further includes a vibration frequency measuring device 49 for measuring the vibration frequency of the surface of the rotating wafer W. As shown in FIG. 10, the vibration frequency measuring device 49 measures the vibration frequency of the surface of the wafer W that is being rotated by the holding rollers 71, 72, 73, 74.

Figure 11:
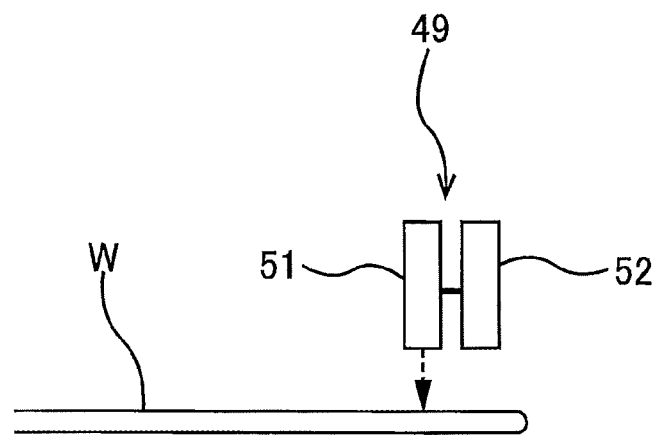
FIG. 11 is a schematic view showing an example of a vibration frequency measuring device shown in FIG. 10.

FIG. 11 is a schematic view showing an example of the vibration frequency measuring device 49 shown in FIG. 10. This vibration frequency measuring device 49 has a displacement sensor 51 for measuring a displacement of the surface of the wafer W, and a vibration analyzer 52 for determining the vibration frequency of the surface of the wafer W from fluctuation of measured values of the displacement. The displacement sensor 51 is oriented toward a peripheral portion of the wafer W, and is configured to measure the displacement of the rotating wafer W and send the measured value of the displacement to the vibration analyzer 52. This vibration analyzer 52 is configured to determine the vibration frequency of the surface of the wafer W from the measured value of the displacement that varies periodically with time. The displacement sensor 51 may be a laser displacement meter which can measure the displacement of the surface of the wafer W without contacting the wafer W.

Figure 12:
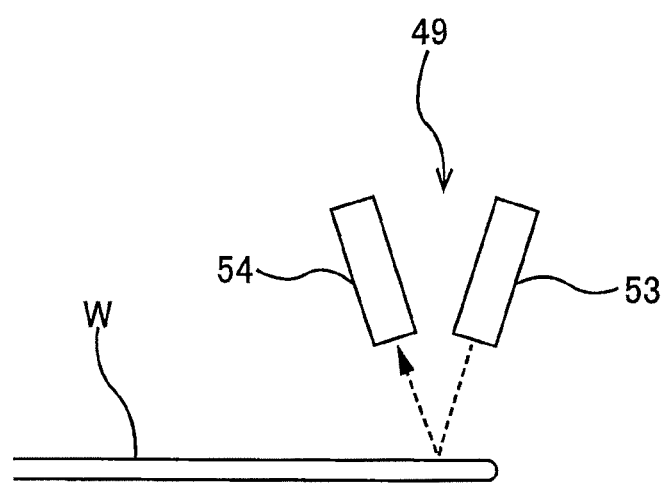
FIG. 12 is a schematic view showing another example of the vibration frequency measuring device shown in FIG. 10.

FIG. 12 is a schematic view showing another example of the vibration frequency measuring device 49 shown in FIG. 10. This vibration frequency measuring device 49 has an irradiator 53 for irradiating the surface of the wafer W with light, and a vibration analyzer 54 for receiving reflected light from the wafer W and determining the vibration frequency from fluctuation of an intensity of the reflected light. The vibration analyzer 54 is configured to determine the vibration frequency of the surface of the wafer W from the intensity of the reflected light that varies periodically with time.

The vibration frequency measured by the vibration frequency measuring device 49 and the natural frequency determined by the natural frequency calculator 41 are sent to the processing controller 43. This processing controller 43 controls the rotational speed of the wafer W such that the wafer W is rotated at a rotational speed that is different from rotational speeds corresponding to the natural frequency and the vibration frequency of the wafer W.

The displacement sensor 51 and the vibration analyzer 54 may measure the amplitude of the vibration of the wafer W during processing of the wafer W and the processing controller 43 may stop the rotation of the wafer W if the amplitude of the vibration of the wafer W is larger than a predetermined threshold value. Such a control operation can prevent a damage to the wafer W.

Figure 13:
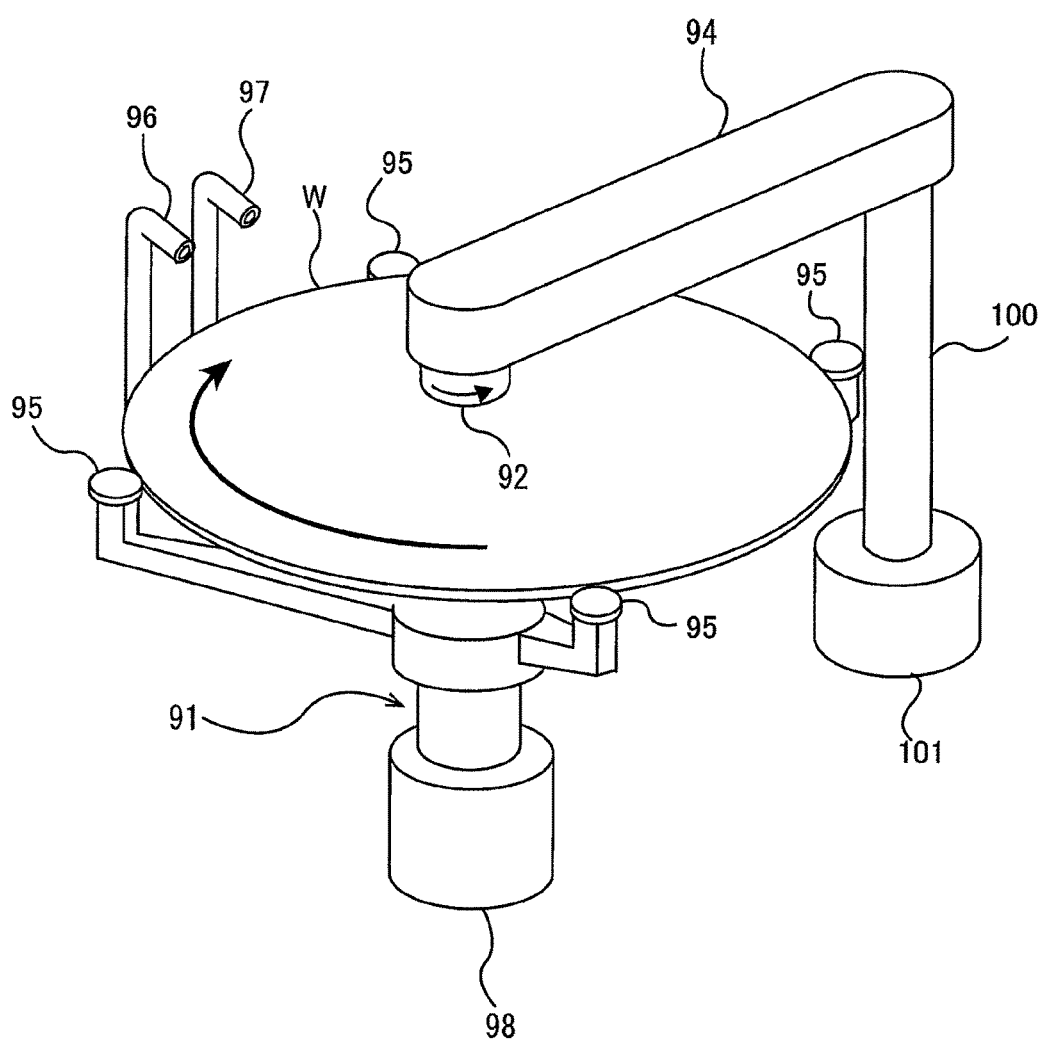
FIG. 13 is a schematic view showing the substrate processing apparatus according to yet another embodiment.

The above-described embodiment of the substrate processing apparatus is a roll sponge type which is designed to hold the wafer with the holding rollers and scrub the wafer with the roll sponges, while the present invention can be applied to other type of substrate processing apparatus. For example, the present invention can be applied to a substrate processing apparatus of pen sponge type as shown in FIG. 13. This type of substrate processing apparatus includes a substrate holder 91 for holding and rotating the wafer W, a pen sponge 92, an arm 94 holding the pen sponge 92, a rinsing liquid supply nozzle 96 for supplying pure water as a rinsing liquid onto the upper surface of the wafer W, and a cleaning liquid supply nozzle 97 for supplying cleaning liquid (chemical liquid) onto the upper surface of the wafer W. The pen sponge 92 is coupled to a rotating device (not shown) disposed in the arm 94, so that the pen sponge 92 is rotated about its central axis extending in a vertical direction.

The substrate holder 91 includes a plurality of chucks 95 (four chucks in FIG. 13) for holding the peripheral portion of the wafer W, and a motor 98 coupled to the chucks 95. The wafer W is horizontally held by these chucks 95. The wafer W, held by the chucks 95, is rotated about its axis by the motor 98.

The arm 94 is disposed above the wafer W. The pen sponge 92 is coupled to one end of the arm 94, and a pivot shaft 100 is coupled to the other end of the arm 94. A motor 101 as an arm rotating device for rotating the arm 94 is coupled to this pivot shaft 100. The arm rotating device may have a reduction gear in addition to the motor 101. The motor 101 is configured to rotate the pivot shaft 100 through a certain angle to thereby rotate the arm 94 in a plane in parallel with the wafer W. Therefore, as the arm 94 pivots, the pen sponge 92, supported by the arm 94, moves outwardly in the radial direction of the wafer W.

Cleaning of the wafer W is performed as follows. First, the wafer W is rotated about its axis. The cleaning liquid is then supplied onto the upper surface of the wafer W from the cleaning liquid supply nozzle 97. In this state, the pen sponge 92 is brought into sliding contact with the upper surface of the wafer W while the pen sponge 92 is rotating about its axis extending in the vertical direction, and further the pen sponge 92 oscillates in the radial direction of the wafer W. The wafer W is scrubbed by the pen-sponge 92 that is placed in sliding contact with the upper surface of the wafer W in the presence of the cleaning liquid.

After scrubbing, in order to wash away the cleaning liquid from the wafer W, the pure water as the rinsing liquid is supplied onto the upper surface of the rotating wafer W from the pure water supply nozzle 96 to thereby rinse the wafer W. Subsequently, the supply of the pure water onto the wafer W is stopped. The rinsing of the wafer W may be performed while rubbing the pen sponge 92 against the wafer W or while keeping the pen sponge 92 away from the wafer W.

Figure 14:
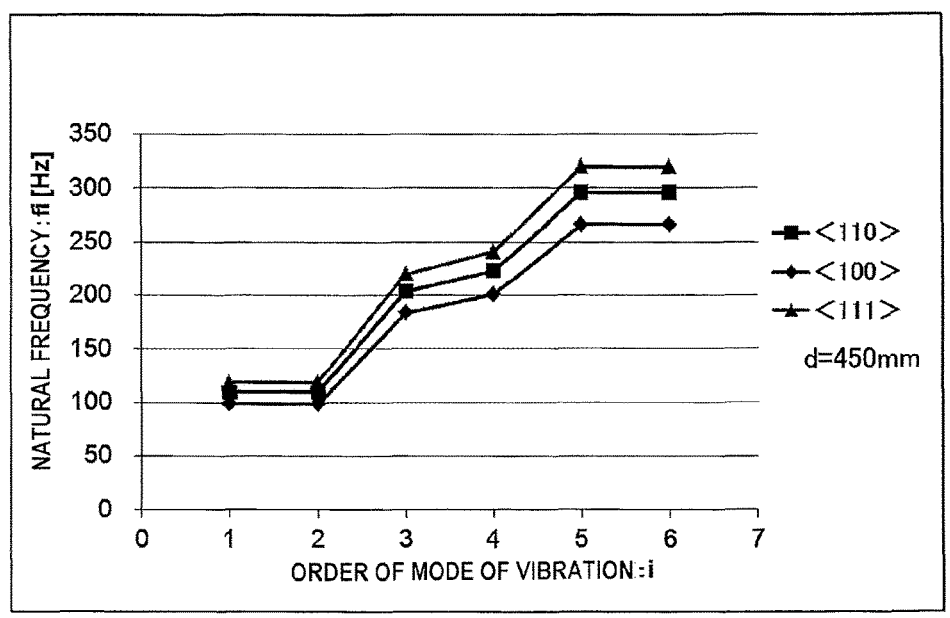
FIG. 14 is a graph illustrating a change in the calculated value of the natural frequency in accordance with a crystal orientation of a wafer.

FIG. 14 is a graph illustrating a change in the calculated value of the natural frequency in accordance with a crystal orientation of a wafer. In FIG. 14, the crystal orientation of the wafer is expressed as Miller index. The Young's modulus and the Poisson's ratio vary depending on the crystal orientation of the wafer. Therefore, as shown in FIG. 14, the natural frequency of the wafer varies depending on the crystal orientation of the wafer. Thus, it is preferable to change the Young's modulus and the Poisson's ratio when used in the calculation of the natural frequency, in accordance with a relative angle between the chucks 95 and the crystal orientation of the wafer W.

Figure 15:
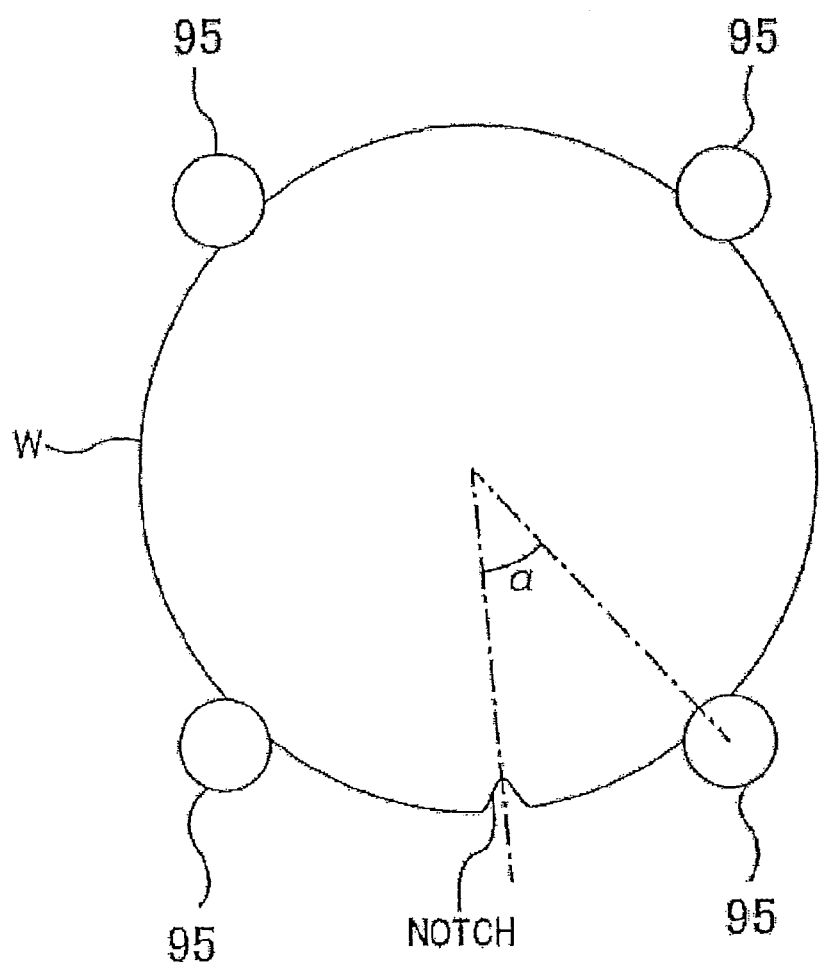
FIG. 15 is a plan view showing a positional relationship between the crystal orientation of the wafer and a substrate holder that includes a plurality of chucks.

Typically, the crystal orientation of the wafer W is indicated by a position of a notch formed in the wafer W. As shown in FIG. 15, where the above-described relative angle is defined as an angle α between a line connecting one of the plurality of chucks 95 of the substrate holder to a center of the wafer W and a line connecting the notch to the center of the wafer W, the natural frequency calculator 41 determines the Young's modulus and the Poisson's ratio from the angle α and a data base, and calculates the natural frequency with use of the above-described equations (1) and (2). The data base is constituted by the relative angle and data of the corresponding Young's modulus and the corresponding Poisson's ratio, and is stored in advance in the natural frequency calculator 41. The above-described relative angle α can be calculated from an image of the wafer W and the chucks 95 that is captured by an camera (not shown) disposed above the wafer W.

Figure 16:
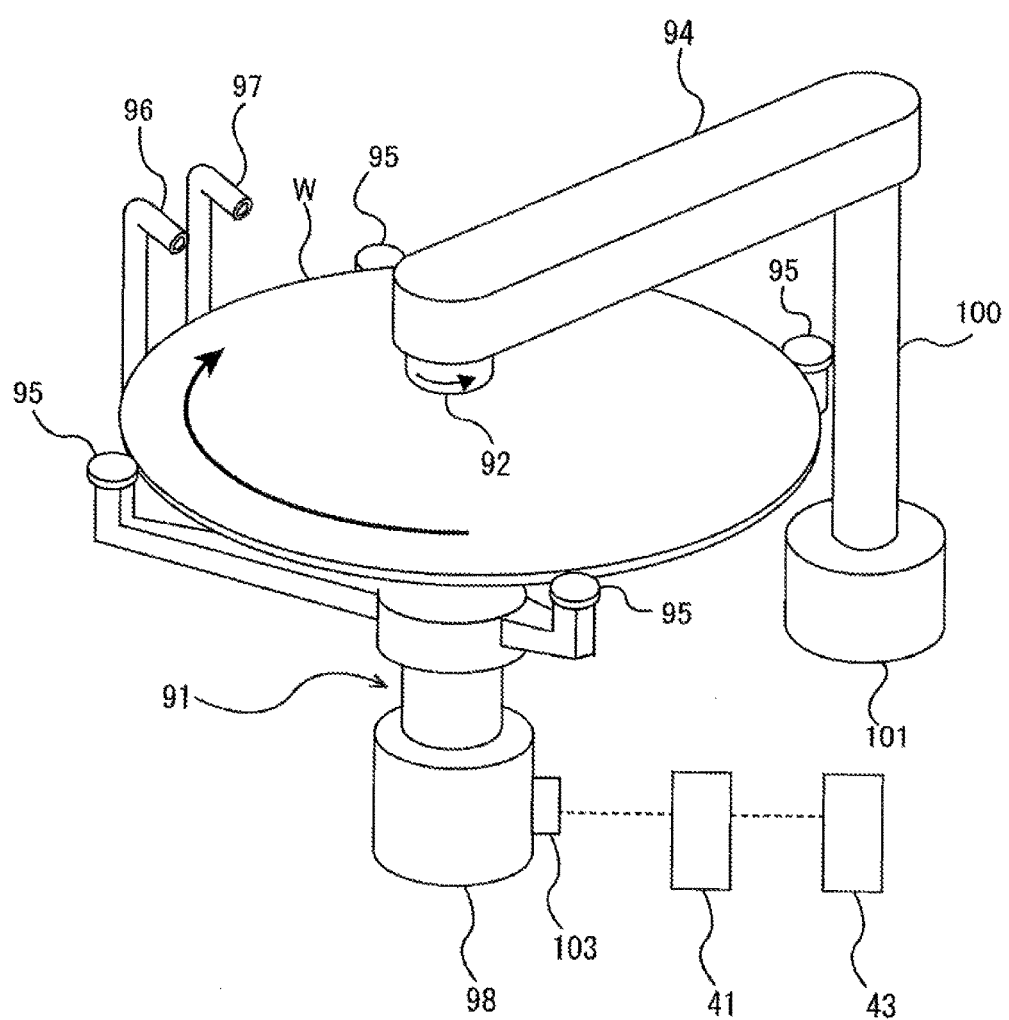
FIG. 16 is a view showing another embodiment of the substrate processing apparatus shown in FIG. 13.

In the above-discussed embodiments, the rotational speed of the wafer W is controlled based on the natural frequency of the wafer W. In another embodiment, the rotational speed of the wafer W may be controlled based on a natural frequency of a rotational element including the wafer W and the substrate holder 91. FIG. 16 is a view showing another embodiment of the substrate processing apparatus shown in FIG. 13. As shown in FIG. 16, a vibrometer 103 is attached to the substrate holder 91. This vibrometer 103 is configured to output a waveform signal that indicates a vibration of the rotational element during processing of the wafer W, and send the waveform signal to the natural frequency calculator 41. This natural frequency calculator 41 analyzes the waveform signal with use of FFT (fast Fourier transformation) to obtain a relationship between the frequency and the amplitude of the vibration and determines the natural frequency of the rotational element which is a peak frequency at which the amplitude is maximized.

The natural frequency measured by the natural frequency calculator 41 is sent to the processing controller 43. The processing controller 43 controls the rotational speed of the wafer W such that the wafer W is rotated at a rotational speed that is different from a rotational speed corresponding to the natural frequency of the rotational element. In the embodiment shown in FIG. 16 the vibrometer 103 is attached to the motor 101, while in one embodiment the vibrometer 103 may be attached to other part of the substrate holder 91.

The above-discussed embodiments of the present invention are directed to an apparatus for cleaning the substrate, while the substrate processing apparatus according to the present invention may be applied to a substrate drying apparatus for drying a substrate by rotating the substrate.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A substrate processing apparatus for processing a substrate for use in manufacturing of a semiconductor device, comprising:
    a substrate holder having chucks configured to hold a peripheral portion of a substrate and rotate the substrate;
    a camera configured to take an image of the substrate holder and the substrate;
    a natural frequency calculator storing a database comprising relative angles between a line connecting one of the chucks to a center of the substrate and a line connecting a notch of the substrate to the center of the substrate and data of corresponding Young's modulus and corresponding Poisson's ratio, the natural frequency calculator being configured to calculate a relative angle between the line connecting one of the chucks to the center of the substrate and the line connecting the notch of the substrate to the center of the substrate from the image, determine a Young's modulus and a Poisson's ratio corresponding to the calculated relative angle, and calculate a natural frequency of the substrate from specifications inherent in the substrate including the determined Young's modulus and the determined Poisson's ratio; and
    a processing controller configured to control a rotational speed of the substrate based on the natural frequency of the substrate.

2. The substrate processing apparatus according to claim 1, wherein the processing controller is configured to control the rotational speed of the substrate such that the substrate is rotated at a rotational speed that is different from a rotational speed corresponding to the natural frequency of the substrate.

3. The substrate processing apparatus according to claim 1, wherein the natural frequency calculator stores therein an equation for calculating the natural frequency of the substrate from the specifications inherent in the substrate.

4. The substrate processing apparatus according to claim 1, wherein the specifications inherent in the substrate include at least a thickness, a diameter, a density, the Young's modulus, and the Poisson's ratio of the substrate.

5. The substrate processing apparatus according to claim 1, further comprising:
    a vibration frequency measuring device configured to measure a vibration frequency of a surface of the substrate when being rotated,
    wherein the processing controller is configured to control the rotational speed of the substrate such that the substrate is rotated at a rotational speed that is different from rotational speeds corresponding respectively to the natural frequency and the vibration frequency of the substrate.

6. The substrate processing apparatus according to claim 5, wherein the vibration frequency measuring device includes a displacement sensor configured to measure a displacement of the surface of the substrate, and the vibration frequency measuring device is configured to determine the vibration frequency from fluctuation of the displacement.

7. The substrate processing apparatus according to claim 5, wherein the vibration frequency measuring device is configured to irradiate the surface of the substrate with light, receive reflected light from the substrate, and determine the vibration frequency from fluctuation of an intensity of the reflected light.

8. The substrate processing apparatus according to claim 1, wherein the processing controller is configured to change a processing time of the substrate based on the rotational speed of the substrate.

9. The substrate processing apparatus according to claim 1, further comprising:
    a fluid supply nozzle configured to supply a fluid onto a surface of the substrate; and
    a flow-rate regulating valve configured to regulate a flow rate of the fluid,
    wherein the processing controller is configured to control the flow rate of the fluid through the flow-rate regulating valve based on the rotational speed of the substrate.

10. The substrate processing apparatus according to claim 1, wherein the natural frequency calculator is configured to measure an amplitude of a vibration of the substrate when being rotated, and the processing controller is configured to stop the rotation of the substrate after the amplitude of the vibration of the substrate exceeds a predetermined threshold value.

11. A substrate processing apparatus for processing a substrate for use in manufacturing of a semiconductor device, comprising:
    a substrate holder configured to hold a peripheral portion of a substrate and rotate the substrate;
    an acoustic-wave generator configured to emit an acoustic wave toward the substrate while changing a frequency of the acoustic wave when the substrate is held by the substrate holder;
    an acoustic-wave analyzer configured to measure an amplitude of the acoustic wave reflected from the substrate, analyze the acoustic wave, reflected from the substrate, with use of fast Fourier transformation to obtain a relationship between the frequency and the amplitude of the acoustic wave, and determine a natural frequency of the substrate when the substrate is held by the substrate holder, the natural frequency being a peak frequency at which the amplitude is maximized; and a processing controller configured to control a rotational speed of the substrate such that the substrate is rotated at a rotational speed that is different from a rotational speed corresponding to the natural frequency of the substrate.

12. A substrate processing apparatus for processing a substrate for use in manufacturing of a semiconductor device, comprising:

a substrate holder configured to hold a peripheral portion of a substrate and rotate the substrate;

an acoustic-wave generator configured to emit an acoustic wave toward the substrate to vibrate the substrate while changing a frequency of the acoustic wave when the substrate is held by the substrate holder;

a vibration measuring device configured to measure an amplitude of the vibration of the substrate;

a natural frequency calculator configured to analyze the vibration with use of fast Fourier transformation to obtain a relationship between the frequency and the amplitude of the vibration, and determine a natural frequency of the substrate when the substrate is held by the substrate holder, the natural frequency being a peak frequency at which the amplitude is maximized; and a processing controller configured to control a rotational speed of the substrate such that the substrate is rotated at a rotational speed that is different from a rotational speed corresponding to the natural frequency of the substrate.

* * * * *